(12) United States Patent
Aurongzeb

(10) Patent No.: US 11,832,386 B2
(45) Date of Patent: Nov. 28, 2023

(54) SOLDER COMPOSITION FOR USE IN SOLDER JOINTS OF PRINTED CIRCUIT BOARDS

(71) Applicant: Dell Products L.P., Round Rock, TX (US)

(72) Inventor: Deeder M. Aurongzeb, Austin, TX (US)

(73) Assignee: Dell Products L.P., Round Rock, TX (US)

(\*) Notice: Subject to any disclaimer, the term of this patent is extended or adjusted under 35 U.S.C. 154(b) by 85 days.

(21) Appl. No.: 17/644,593

(22) Filed: Dec. 16, 2021

(65) Prior Publication Data

US 2023/0199949 A1 Jun. 22, 2023

(51) Int. Cl.
*B23K 35/00* (2006.01)
*H05K 1/09* (2006.01)
(Continued)

(52) U.S. Cl.
CPC ............ *H05K 1/09* (2013.01); *B23K 1/0016* (2013.01); *B23K 35/22* (2013.01); *B23K 35/262* (2013.01); *C22C 13/02* (2013.01); *H05K 3/4007* (2013.01); *H05K 1/115* (2013.01); *H05K 1/119* (2013.01); *H05K 2201/0323* (2013.01); *H05K 2201/0338* (2013.01); *H05K 2203/043* (2013.01); *H05K 2203/0759* (2013.01); *H05K 2203/1333* (2013.01); *H05K 2203/1366* (2013.01)

(58) Field of Classification Search
CPC ........ H05K 1/09; H05K 3/4007; H05K 1/115; H05K 1/119; H05K 2201/0323; H05K 2201/0338; H05K 2203/043; H05K 2203/0759; H05K 2203/1333; H05K 2203/1366; H05K 3/244; H05K 3/3436; H05K 3/3457; H05K 3/3463; B23K 35/22; B23K 35/262; B23K 35/0244; B23K 35/264; C22C 13/02; C22C 13/00
See application file for complete search history.

(56) References Cited

U.S. PATENT DOCUMENTS 6,824,039 B2\* 11/2004 Wu ............... B23K 35/262
228/56.3
8,418,910 B2\* 4/2013 Yamakami ........... C23C 24/106
228/56.3
(Continued)

FOREIGN PATENT DOCUMENTS

CN 1764515 A \* 4/2006 ........... B23K 35/262
CN 103314652 A \* 9/2013 ........... B22F 1/0074
(Continued)

OTHER PUBLICATIONS

Aksöz, Namik, et al. "Thermal conductivity variation with temperature for lead-free ternary eutectic solders." *Journal of electronic materials* 42.12 (2013): 3573 (Abstract Only).
(Continued)

*Primary Examiner* — Kiley S Stoner
(74) *Attorney, Agent, or Firm* — McDermott Will & Emery LLP

(57) ABSTRACT

A solder composition for use in solder joints of printed circuit boards (PCBs), including a compound layer comprising an alloy of bismuth and tin; and a graphene coating positioned on the compound layer.

11 Claims, 5 Drawing Sheets

(51) Int. Cl.
*H05K 3/40* (2006.01)
*B23K 35/26* (2006.01)
*C22C 13/02* (2006.01)
*B23K 35/22* (2006.01)
*B23K 1/00* (2006.01)
*H05K 1/11* (2006.01)

(56) References Cited

U.S. PATENT DOCUMENTS

| | | | | |
|---|---|---|---|---|
| 11,267,080 B2 | * | 3/2022 | Zhang | B23K 35/264 |
| 2009/0301607 A1 | * | 12/2009 | Nakano | B23K 35/262 148/24 |

FOREIGN PATENT DOCUMENTS

| | | | | | |
|---|---|---|---|---|---|
| CN | 104400247 A | * | 3/2015 | | B23K 35/262 |
| CN | 105215569 A | * | 1/2016 | | |
| CN | 106695158 A | * | 5/2017 | | |
| CN | 107335879 A | * | 11/2017 | | B23K 1/0008 |
| CN | 107695567 A | * | 2/2018 | | |
| CN | 108098184 A | * | 6/2018 | | |
| CN | 110091093 A | * | 8/2019 | | |
| CN | 110666267 A | * | 1/2020 | | B23K 1/0008 |
| CN | 111112881 A | * | 5/2020 | | B23K 35/362 |
| CN | 111230282 A | * | 6/2020 | | B23K 20/122 |
| CN | 112122823 A | * | 12/2020 | | |
| CN | 113001056 A | * | 6/2021 | | |
| CN | 113146092 A | * | 7/2021 | | B23K 35/262 |
| CN | 113199171 A | * | 8/2021 | | |
| CN | 113492277 A | * | 10/2021 | | |
| CN | 113770589 A | * | 12/2021 | | |
| KR | 20190050583 A | * | 5/2019 | | |
| WO | WO-2021049437 A1 | * | 3/2021 | | B23K 1/0016 |
| WO | WO-2022070910 A1 | * | 4/2022 | | |

OTHER PUBLICATIONS

Kubota, Yuto, et al. "Tensile properties of low-melting point Sn—Bi—Sb solder." 2014 IEEE 16th Electronics Packaging Technology Conference (EPTC). IEEE, 2014 (Abstract Only).

Li, J. F., et al. "Interactions between liquid Sn—Bi based solders and contact metals for high temperature applications." Proceedings Electronic Components and Technology, 2005. ECTC'05 . . . IEEE, 2005.

Ping, W. U. "Effects of Zn addition on mechanical properties of eutectic Sn—58Bi solder during liquid-state aging." Transactions of Nonferrous Metals Society of China 25.4 (2015): 1225-1233.

* cited by examiner

SOLDER COMPOSITION FOR USE IN SOLDER JOINTS OF PRINTED CIRCUIT BOARDS

BACKGROUND

Field of the Disclosure

The disclosure relates generally to a solder composition for use in solder joints of printed circuit boards.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

Innovative aspects of the subject matter described in this specification may be embodied in a solder composition for use in solder joints of printed circuit boards (PCBs), including a compound layer comprising an alloy of bismuth and tin; and a graphene coating positioned on the compound layer.

Other embodiments of these aspects include corresponding systems and methods.

These and other embodiments may each optionally include one or more of the following features. For instance, the alloy comprises approximately 50% tin and 50% bismuth. The alloy comprises up to approximately 70% tin and up to approximately 30% bismuth. The alloy further comprises indium. The alloy comprises up to approximately 70% tin, up to approximately 29% bismuth, and up to approximately 1% indium. The solder composition has a melting temperature of approximately 150 degrees Celsius. A grain size of the solder composition is less than 50 micrometers.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

This disclosure discusses a solder composition for use in solder joints of a printed circuit board. In short, a solder ball joint is formed on a printed circuit board that can be formed from a composition alloy including bismuth, tin, and in some cases, indium.

Specifically, this disclosure discusses a solder composition for use in solder joints of printed circuit boards (PCBs), comprising a compound layer comprising an alloy of bismuth and tin; and a graphene coating positioned on the compound layer.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-4 wherein like numbers are used to indicate like and corresponding parts.

Figure 1:
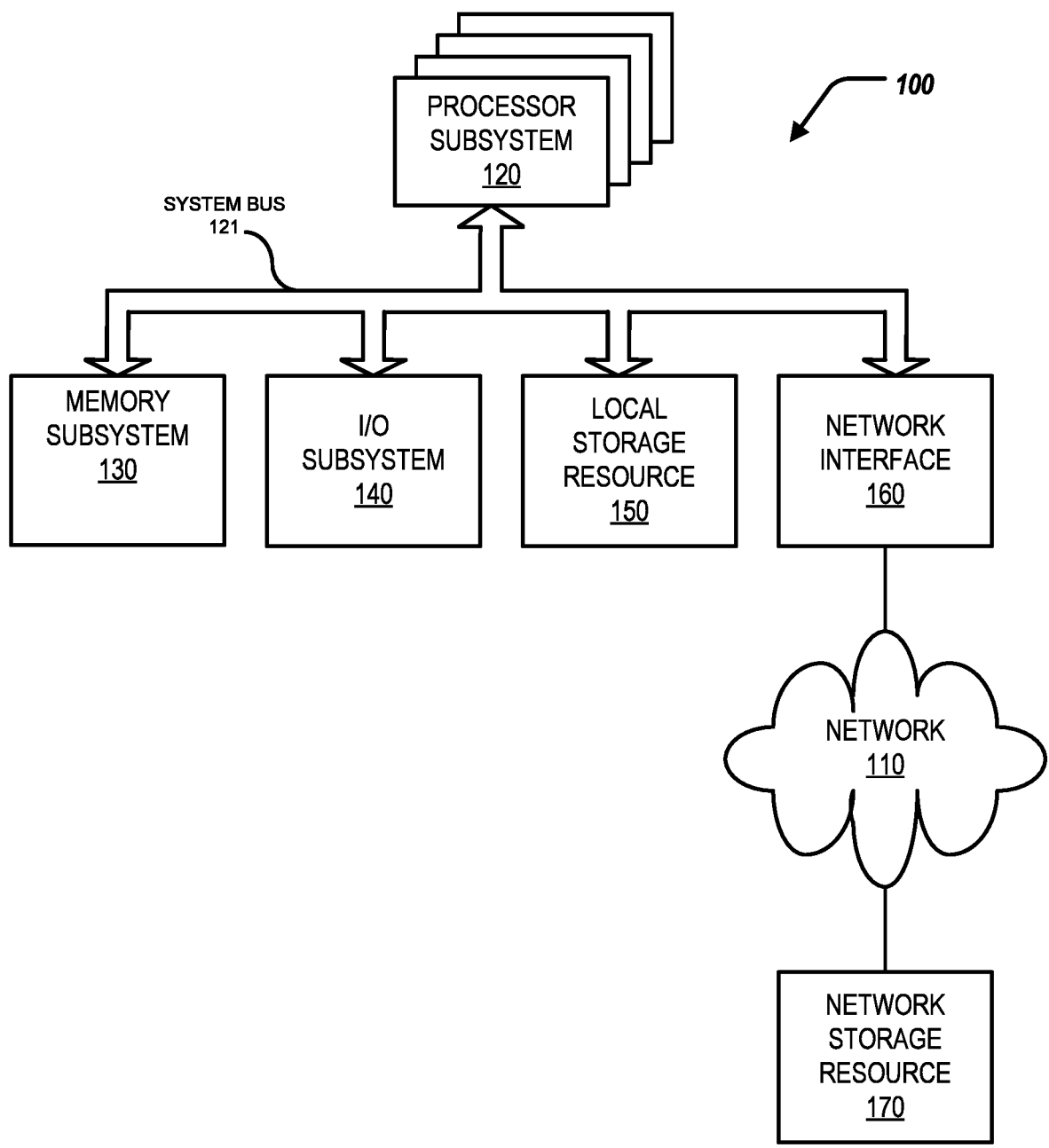
FIG. 1 is a block diagram of selected elements of an embodiment of an information handling system.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, T1, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

In short, a solder ball joint is formed on a printed circuit board that can be formed from a composition alloy including bismuth, tin, and in some cases, indium.

Figure 2:
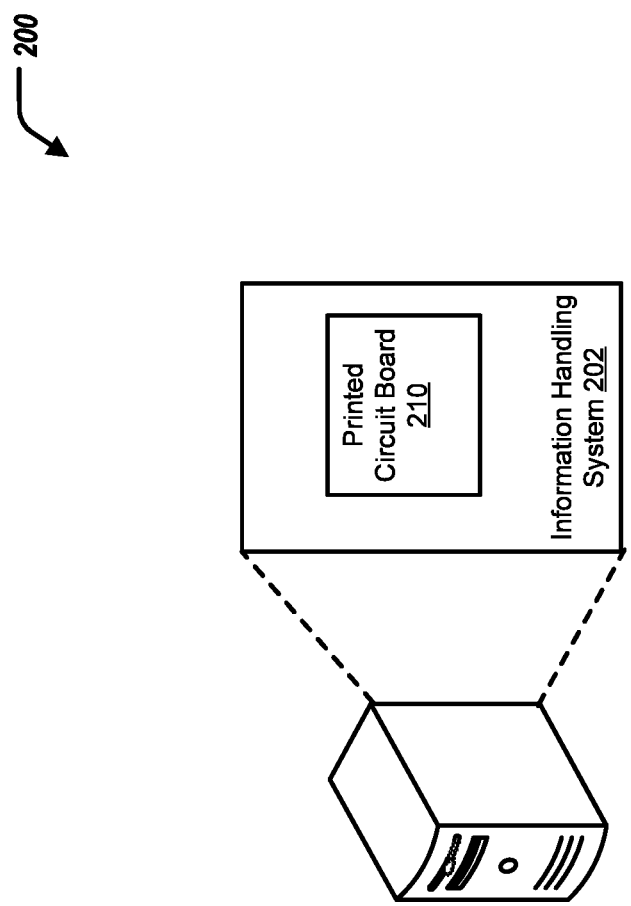
FIG. 2 illustrates a block diagram of an information handling system including a printed circuit board (PCB).

Turning to FIG. 2, FIG. 2 illustrates an environment 200 including an information handling system 202. The information handling system 202 can include a printed circuit board (PCB) 210. In some examples, the information handling system 202 is similar to, or includes, the information handling system 100 of FIG. 1.

Figure 3A:
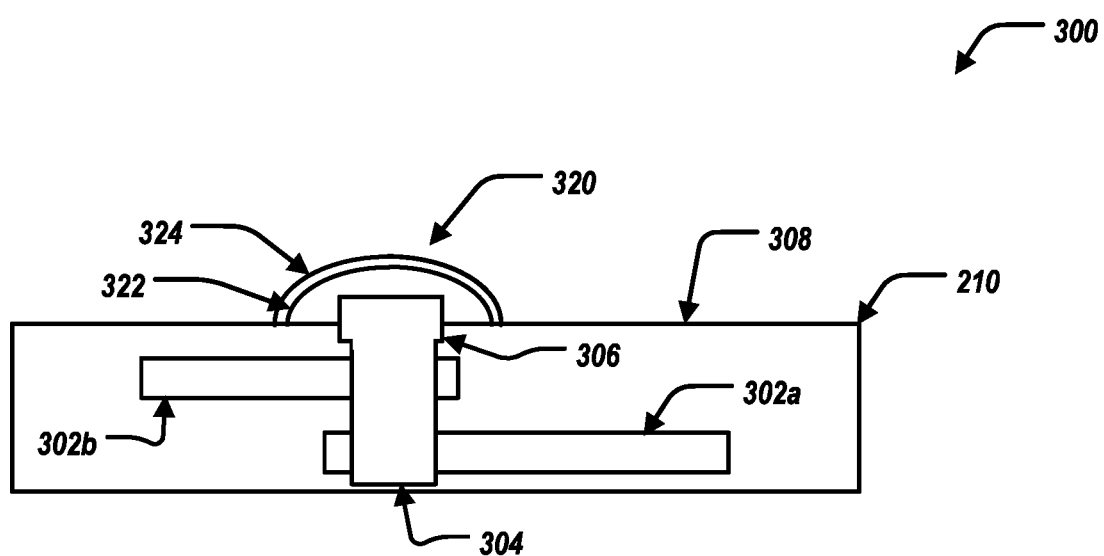
FIG. 3A illustrates a side view of the PCB.
Figure 3B:
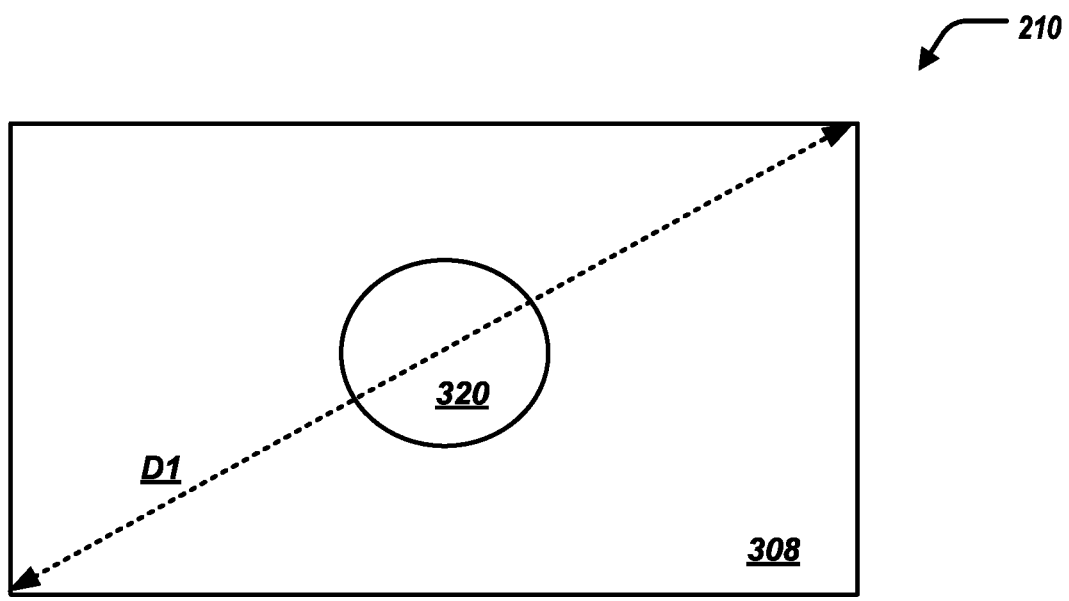
FIG. 3B illustrates a top down view of the PCB.

Turning to FIG. 3, FIG. 3 illustrates a block diagram of the PCB 210. The PCB 210 can include a first trace 302*a* and a second trace 302*b* (collectively referred to as traces 302). The traces 302 can be connected by a via 304 that includes a pad 306 at a surface 308 of the PCB 210. The via 306 can connect the first trace 302*a* with the second trace 302*b*. In some examples, the PCB 210 is greater than 5 centimeters along the direction D1, as shown in FIG. 3B.

A solder ball joint 320 can be formed on the first surface 308 of the PCB 210. In some examples, the solder ball joint 320 has a size of between approximately 1 micrometer to 100 micrometers in diameter. The solder ball joint 320 can be formed from a solder composition.

In some examples, the solder composition can include a compound layer 322 comprising an alloy of bismuth (Bi) and tin (Sn). In some examples, the alloy comprises approximately 50% tin and 50% bismuth. In some examples, the alloy comprises 70% tin and approximately 30% bismuth. In some examples, the alloy comprises between 50%-70% tin and the remaining portion comprised of bismuth. In some examples, the alloy comprises between 30%-50% bismuth and the remaining portion comprised of tin.

In some examples, the solder composition can include the compound layer 322 comprising an alloy of bismuth (Bi), tin (Sn), and indium (In). In some examples, the alloy comprises between 50-70% tin, 1% indium, and the remaining portion comprised of bismuth. In some examples, the alloy comprises between 50-70% tin, 2% indium, and the remaining portion comprised of bismuth. The inclusion of indium in the solder composition can reduce brittleness of the solder composition.

In some examples, the solder composition can include 42SnBi5In; 42SnBi4In; 42SnBi3In; 42SnBi2In; 42SnBi1In; or 42SnBi.

The solder composition can further include a coating layer 324 that is positioned on (surrounding) the compound layer 322. In some examples, the coating layer 324 can include graphene. In some examples, the coating layer can include nickel (Ni). In some examples, the coating layer 324 is approximately 1-50 microns in size. In some examples, the thermal conductivity of the coating layer 324 is between 70-200 Watts per meter-Kelvin (W/mK).

In some examples, the solder composition has a melting temperature of approximately 150 degrees Celsius. In some examples, a grain size of the solder composition is less than 50 micrometers.

Figure 4:
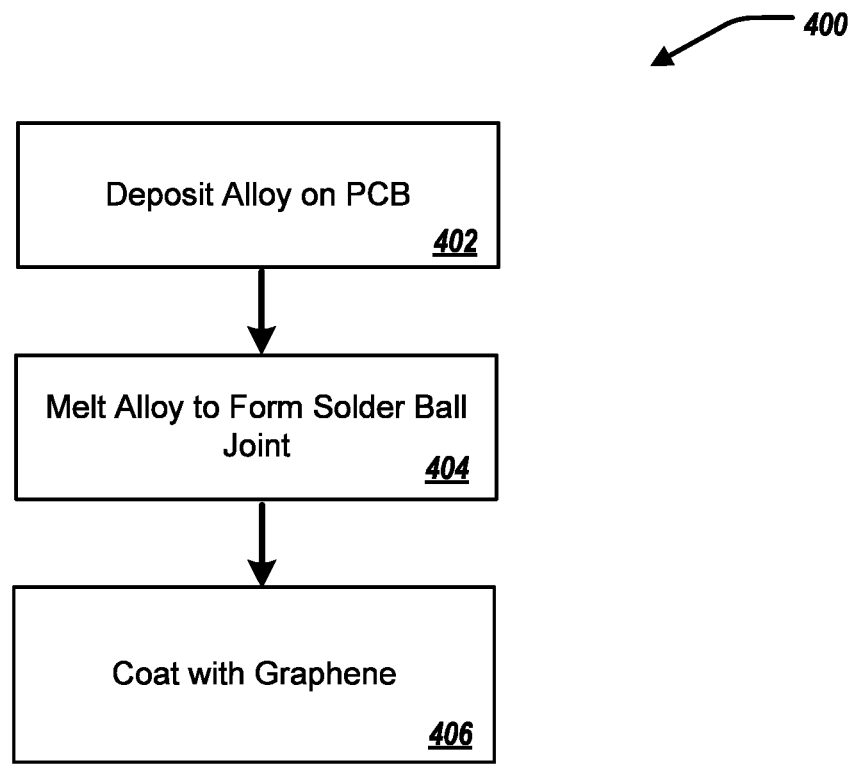
FIG. 4 illustrates a method for depositing a solder composition for use in solder joints of a printed circuit board.

FIG. 4 illustrates a flowchart depicting selected elements of an embodiment of a method 400 for depositing a solder composition for use in solder joints of a printed circuit board. It is noted that certain operations described in method 400 may be optional or may be rearranged in different embodiments.

An alloy is deposited on the first surface 308 of the PCB 210 (402). In some examples, the alloy comprises bismuth and tin, and forms the compound layer 322 on the PCB 210.

In some examples, approximately 50 nanometers of tin is deposited, and then approximately 50 nanometers of bismuth is deposited (without vacuum break). In some examples, tin is the first interface with the first surface 308 of the PCB 210. The alloy is melted to form the solder ball joint 320 on the PCB 210 (404). In some examples, the solder ball joint 320 is melted 50/50 by weight. The compound layer 322 is coated with the coating layer 324 (406). In some examples, the compound layer 322 is coated with a graphene, e.g., by a micro nozzle spray with 1-60 micron tip. In some examples, the compound layer 322 is deposited via a graphene loaded resin that is reflowed on the compound layer 322.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A solder composition for use in solder joints of printed circuit boards (PCBs), comprising:
   a compound layer comprising an alloy of bismuth, tin, and indium; and
   a graphene coating positioned on the compound layer,
   wherein the alloy comprises up to approximately 70% tin, up to approximately 29% bismuth, and up to approximately 1% indium.

2. The solder composition of claim 1, wherein the solder composition has a melting temperature of approximately 150 degrees Celsius.

3. The solder composition of claim 1, wherein a grain size of the solder composition is less than 50 micrometers.

4. A printed circuit board, including:
a first surface including a via connected to one or more traces;
a solder ball joint formed on the via, the solder ball joint formed from a solder composition including:
a compound layer comprising an alloy of bismuth, tin, and indium; and
a graphene coating positioned on the compound layer, wherein the alloy comprises up to approximately 70% tin, up to approximately 29% bismuth, and up to approximately 1% indium.

5. The printed circuit board of claim 4, wherein the solder composition has a melting temperature of approximately 150 degrees Celsius.

6. The printed circuit board of claim 4, wherein a grain size of the solder composition is less than 50 micrometers.

7. The printed circuit board of claim 4, wherein the solder ball joint has a size of between approximately 1 micrometer to 100 micrometers.

8. The printed circuit board of claim 4, wherein the printed circuit board is greater than 5 centimeters diagonally.

9. A method of depositing a solder joint composition on a printed circuit board (PCB), comprising:
depositing an alloy comprising bismuth, tin, and indium on the PCB to form a compound layer;
melting the alloy to form a solder ball joint on the PCB; and
coating the compound layer with graphene,
wherein the alloy comprises up to approximately 70% tin, up to approximately 29% bismuth, and up to approximately 1% indium.

10. The method of claim 9, wherein the coating the compound layer with graphene includes depositing the graphene on the compound layer using a micro-spray nozzle.

11. The method of claim 9, wherein depositing the graphene on the compound layer includes reflowing a resin including the graphene on the compound layer.

* * * * *